(12) United States Patent
Sha et al.

(10) Patent No.: US 6,845,292 B2
(45) Date of Patent: Jan. 18, 2005

(54) TRANSFER APPARATUS AND METHOD FOR SEMICONDUCTOR PROCESS AND SEMICONDUCTOR PROCESSING SYSTEM

(75) Inventors: Lin Sha, Tsukui-gun (JP); Yicheng Li, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/467,345

(22) PCT Filed: Jan. 23, 2002

(86) PCT No.: PCT/JP02/00449
§ 371 (c)(1),
(2), (4) Date: Aug. 20, 2003

(65) Prior Publication Data
US 2004/0158347 A1 Aug. 12, 2004

(30) Foreign Application Priority Data
Feb. 20, 2001 (JP) ........................................ 2001-044249

(51) Int. Cl.[7] .............................................. G06F 17/00
(52) U.S. Cl. ........................ 700/218; 700/259; 414/936; 414/941; 901/46; 901/47
(58) Field of Search ................................. 700/213, 218, 700/245, 259; 414/936, 941; 901/46, 47

(56) References Cited

U.S. PATENT DOCUMENTS

| | | | |
|---|---|---|---|
| 5,483,138 A | | 1/1996 | Shmookler et al. |
| 5,566,076 A | * | 10/1996 | Kuroda ........................ 700/213 |
| 5,905,850 A | * | 5/1999 | Kaveh ......................... 700/259 |
| 5,917,601 A | | 6/1999 | Shimazaki et al. |
| 6,002,840 A | * | 12/1999 | Hofmeister ................. 700/245 |
| 6,313,596 B1 | * | 11/2001 | Wyka et al. ................. 318/640 |
| 6,339,730 B1 | | 1/2002 | Matsushima |
| 6,516,244 B1 | * | 2/2003 | Yoo et al. .................... 700/218 |
| 6,522,942 B2 | * | 2/2003 | Kondo et al. ................ 700/218 |
| 6,549,825 B2 | * | 4/2003 | Kurata ........................ 700/245 |
| 6,591,161 B2 | * | 7/2003 | Yoo et al. .................... 700/218 |
| 6,690,993 B2 | * | 2/2004 | Foulke et al. ................ 700/218 |
| 6,748,293 B1 | * | 6/2004 | Larsen ........................ 700/218 |
| 6,752,585 B2 | * | 6/2004 | Reimer et al. ............... 414/783 |

FOREIGN PATENT DOCUMENTS

| | | |
|---|---|---|
| EP | 820091 | 1/1998 |
| JP | 9-232407 | 9/1997 |
| JP | 9-283604 | 10/1997 |
| JP | 10-247681 | 9/1998 |
| JP | 10-279049 | 10/1998 |
| JP | 11-254359 | 9/1999 |
| JP | 2002-43394 | 2/2002 |

* cited by examiner

*Primary Examiner*—Khoi H. Tran
(74) *Attorney, Agent, or Firm*—Oblon, Spivak, McClelland, Maier & Neustadt, P.C.

(57) ABSTRACT

A transfer apparatus (42) for a semiconductor processing system includes a transfer member (44) having a support portion (48) to place a target substrate (W) thereon, and a drive unit (68) for driving the transfer member (44). A reference mark (54) is disposed adjacent to the support portion (48). The target substrate (W) has optically observable first and second portions (84, 86). A storage section (63) stores a normal image that shows a positional correlation between the reference mark (54) and the first and second portions (84, 86), obtained when the target substrate (W) is placed on the support portion (48) at a normal position. An image pick-up device (62A) takes a detection image that shows a positional correlation between the reference mark (54) and the first and second portions (84, 86), when the transfer member (44) transfers the target substrate (W). An information processing unit (62B) obtains a misalignment amount of the target substrate (W) relative to the normal position, based on the normal image and the detection image.

20 Claims, 4 Drawing Sheets

TRANSFER APPARATUS AND METHOD FOR SEMICONDUCTOR PROCESS AND SEMICONDUCTOR PROCESSING SYSTEM

TECHNICAL FIELD

The present invention relates to a transfer apparatus and method for transferring a target substrate, such as a semiconductor wafer, in a semiconductor processing system, and also relates to a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

BACKGROUND ART

In the process of manufacturing semiconductor integrated circuits (ICs), a semiconductor wafer is subjected to various processes, such as film formation, oxidation, diffusion, annealing, modification, and etching. A processing system of the so-called cluster tool type, in which process chambers for performing respective processes are connected to a common transfer chamber, is known as a system for efficiently performing the processes described above. In the processing system of the cluster tool type, wafers are transferred between the process chambers by a transfer apparatus disposed in the common transfer chamber.

FIG. 7 is a schematic plan view showing a conventional processing system of the cluster tool type. As shown in FIG. 7, for example, the processing system 2 has a plurality of, e.g., three in this case, process chambers 8A to 8C, which are connected to a common transfer chamber 4 that can be vacuum-exhausted, respectively via gate valves 6A to 6C. The process chambers 8A to 8C are respectively provided with worktables 10A to 10C disposed therein, for placing a semiconductor wafer W on the top surface. Two cassette chambers 14A and 14B are connected to the common transfer chamber 4 respectively via gate valves 12A and 12B, and configured to accommodate a cassette for storing semiconductor wafers, which are almost circular.

The common transfer chamber 4 is provided with a transfer apparatus 16 disposed therein and formed of, e.g., an articulated arm, which is rotatable and extensible/contractible. The transfer apparatus 16 has a support portion 18 to hold a wafer W, and transfer and deliver it between each of the cassette chambers 14A and 14B and each of the process chambers 8A to 8C, and between the process chambers 8A to 8C. The common transfer chamber 4 is provided with an orienter 17 provided therein, for allowing the transfer apparatus 16 to hold a wafer W in the proper direction and at the proper position.

When the transfer apparatus transfers a wafer W, the wafer W is not necessarily accurately placed at the normal position on the support portion 18 of the transfer apparatus 16. If a wafer W with a misalignment is placed as it is on the worktable of a next process chamber, the process suffers ill effects. Accordingly, it is necessary to correct the misalignment of the wafer W, so that the wafer W is placed on the worktable of the process chamber at the proper position.

A misalignment of a wafer W occurs in the following cases. When the gas pressure in the process chambers 8A to 8C changes, the wafer W may slip on the worktables 10A to 10C. When the wafer W is delivered, the wafer may slip on the worktables 10A to 10C. Where the worktables 10A to 10C are respectively provided with electrostatic chucks, the wafer may be popped by a residual charge, when a wafer W is delivered from the worktables 10A to 10C. This latter phenomenon occurs, if the change on the wafer W has not been sufficiently removed when the wafer W is delivered from the worktables 10A to 10C.

U.S. Pat. No. 5,917,601 (Jpn. Pat. Appln. KOKAI Publication No. 10-223732), Jpn. Pat. Appln. KOKAI Publication No. 10-247681, and U.S. Pat. No. 5,483,138 disclose a misalignment detector to solve the problems described above.

The processing system shown in FIG. 7 also has a conventional misalignment detector. Specifically, in the common transfer chamber 4, a pair of line sensors 20 and 22 are disposed with a certain distance therebetween near each of the gate valves 6A to 6C of the process chambers 8A to 8C. When a wafer W passes between the line sensors 20 and 22, the wafer W is temporarily stopped, and two positions on the edge (positions on the peripheral contour) thereof are detected. On the basis of these detected values, it is possible to obtain how much misalignment exists between the center of the wafer and the normal position on the support portion 18. The control section of the transfer apparatus 16 controls the rotation amount and extension/contraction amount of the transfer apparatus 16 to offset the obtained misalignment amount, so as to place the wafer W on the worktable at the proper position.

This misalignment detector requires a wafer W in transfer to be temporarily stopped at a position corresponding to the line sensors 20 and 22, so as to detect a misalignment amount. For example, the necessary stop time is about 2 to 3 seconds, depending on the performance of the line sensors 20 and 22. Accordingly, the wafer transfer cannot be speeded up, thereby lowering the throughput. This brings about a serious problem, particularly where a wafer is subjected to a number of processes in different process chambers in one processing system 2. This is so, because the wafer in transfer has to be temporarily stopped every time when the wafer is transferred into each of the process chambers, so as to detect a misalignment amount.

DISCLOSURE OF INVENTION

An object of the present invention is to provide a transfer apparatus and transfer method, and a semiconductor processing system, which can detect a misalignment amount of a target substrate without stopping a transfer operation of the target substrate, thereby improving the throughput.

According to a first aspect of the present invention, there is provided a transfer apparatus for transferring a target substrate, which has optically observable first and second portions, in a semiconductor processing system, the apparatus comprising:

a transfer member having a support portion to place the target substrate thereon;

a drive unit configured to drive the transfer member so as to transfer the target substrate;

a reference mark disposed adjacent to the support portion, and configured to move integratedly with the support portion when the transfer member transfers the target substrate;

a storage section, which stores a normal image that shows a positional correlation between the reference mark and the first and second portions, obtained when the target substrate is placed on the support portion at a normal position;

an image pick-up device configured to take a detection image that shows a positional correlation between the reference mark and the first and second portions, when the transfer member transfers the target substrate; and an information processing unit configured to obtain a misalignment amount of the target substrate relative to the normal position, based on the normal image and the detection image.

According to a second aspect of the present invention, there is provided a semiconductor processing system, comprising:

a plurality of airtight process chambers configured to perform processes on a target substrate, which has optically observable first and second portions;

an airtight common transfer chamber connected to the plurality of process chambers respectively via gates; and a transfer apparatus disposed in the transfer chamber to transfer the target substrate, wherein the transfer apparatus comprises a transfer member having a support portion to place the target substrate thereon, and being extensible/contractible and rotatable, a drive unit configured to drive the transfer member so as to transfer the target substrate, a reference mark disposed adjacent to the support portion, and configured to move integratedly with the support portion when the transfer member transfers the target substrate, a storage section, which stores a normal image that shows a positional correlation between the reference mark and the first and second portions, obtained when the target substrate is placed on the support portion at a normal position, an image pick-up device configured to take a detection image that shows a positional correlation between the reference mark and the first and second portions, when the transfer member transfers the target substrate, an information processing unit configured to obtain a misalignment amount of the target substrate relative to the normal position, based on the normal image and the detection image, and a control section configured to control the drive unit so as to offset a misalignment amount of the target substrate obtained by the information processing unit, when the transfer member transfers the target substrate into the process chamber.

According to a third aspect of the present invention, there is provided a transfer method for transferring a target substrate, which has optically observable first and second portions, in a semiconductor processing system, the method comprising:

preparing a transfer apparatus, which comprises
 a transfer member having a support portion to place the target substrate thereon,
 a drive unit configured to drive the transfer member so as to transfer the target substrate, and
 a reference mark disposed adjacent to the support portion, and configured to move integratedly with the support portion when the transfer member transfers the target substrate;

storing a normal image that shows a positional correlation between the reference mark and the first and second portions, obtained when the target substrate is placed on the support portion at a normal position;

taking a detection image that shows a positional correlation between the reference mark and the first and second portions, when the transfer member transfers the target substrate; and obtaining a misalignment amount of the target substrate relative to the normal position, based on the normal image and the detection image.

BEST MODE FOR CARRYING OUT THE INVENTION

Figure 1:
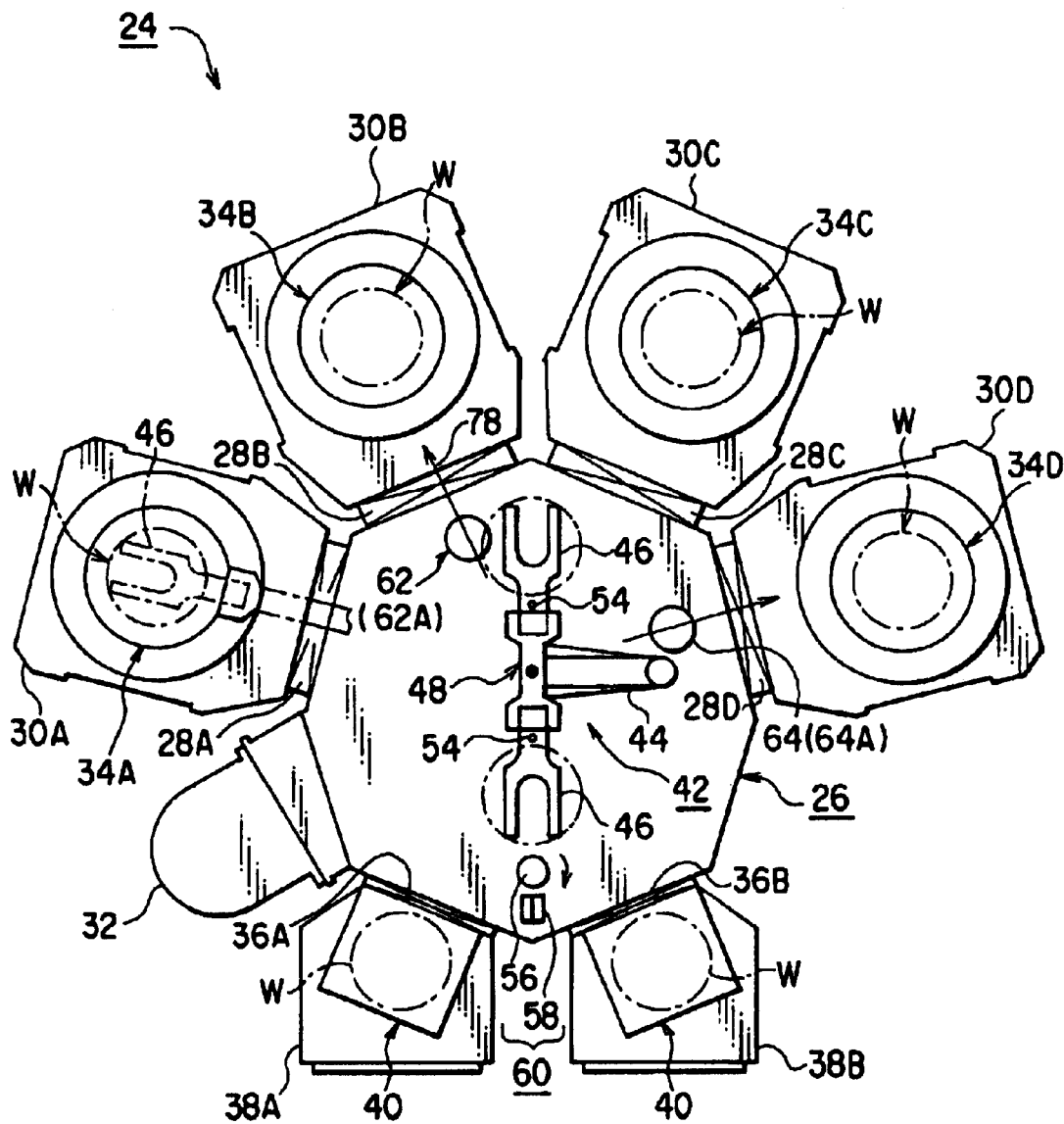
FIG. 1 is a schematic plan view showing a semiconductor processing system of the cluster tool type according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a schematic plan view showing a semiconductor processing system of the cluster tool type according to an embodiment of the present invention. As shown in FIG. 1, the processing system 24 has a common transfer chamber 26, which has an almost regular octagonal shape with eight ports, and can be vacuum-exhausted. Four of the ports of the common transfer chamber 26 are respectively connected to process chambers 30A to 30D via gate valves 28A to 28D. Two of the ports of the common transfer chamber 26 are respectively connected to two cassette chambers 38A and 38B via gate valves 36A and 36B. One of the ports of the common transfer chamber 26 is connected to a cooling process chamber 32, which is open to the inside of the common transfer chamber 26. The other one of the ports of the common transfer chamber 26 is closed.

Each of the cassette chambers 38A and 38B accommodate a cassette 40, which stores almost circular wafers W. The process chambers 30A to 30D are respectively provided with worktables 34A to 34D disposed therein for holding a target substrate or semiconductor wafer W thereon. The process chambers 30A to 30D are configured to subject a wafer to several semiconductor processes selected from the group of, e.g., plasma or thermal CVD, annealing, plasma or plasma-less etching, oxidation, diffusion, and modification.

For example, in this embodiment, the first process chamber 30A is used for performing a first CVD process of depositing a first tantalum oxide film. The second process chamber 30B is used for performing a first modification process of modifying the first tantalum oxide film with ultraviolet rays. The third process chamber 30C is used for performing a second CVD process of depositing a second tantalum oxide film. The fourth process chamber 30D is used for performing a second modification process of modifying the second tantalum oxide film with ultraviolet rays.

The common transfer chamber 26 is provided with an orienter (alignment mechanism) 60 disposed therein near the cassette chambers 38A and 38B, for performing alignment of a wafer W. The orienter 60 includes a rotary table 56 for holding and rotating the wafer W, and a line sensor 58 or the like for detecting positional fluctuations of the peripheral contour of the wafer W. The alignment mechanism 60 may be disposed outside the processing system, instead of inside the common transfer chamber.

Figure 2:
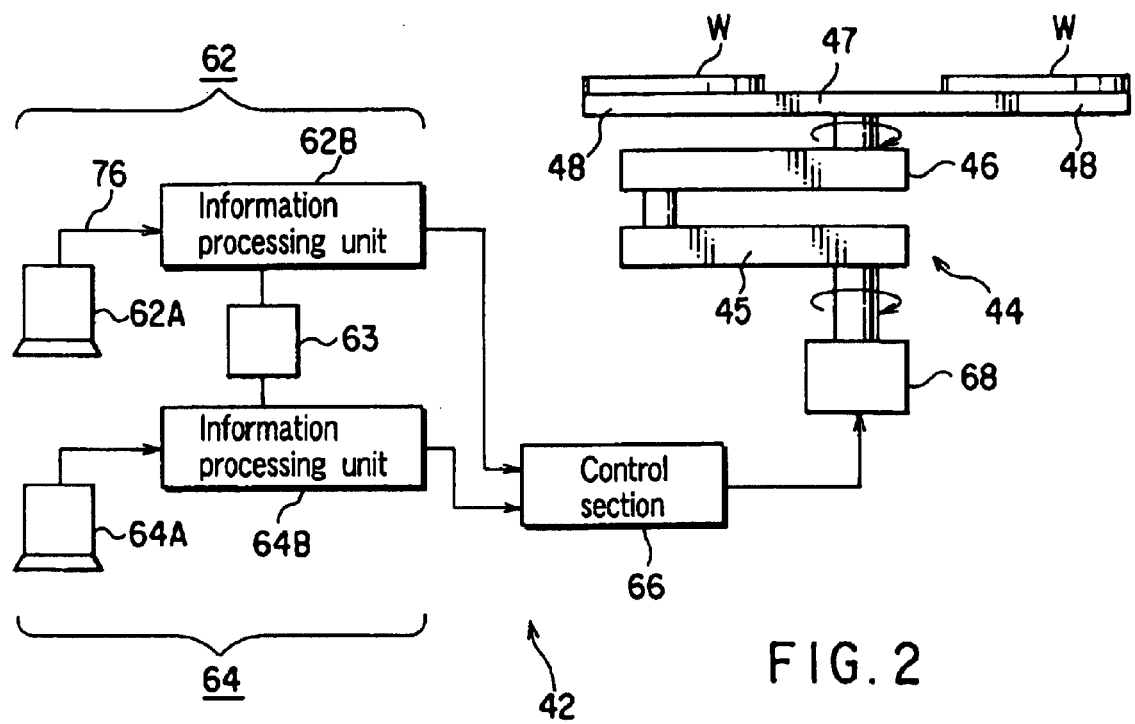
FIG. 2 is a block diagram showing the correlation between the transfer arm, misalignment detectors, and control section, of a transfer apparatus provided in the system shown in FIG. 1.
Figure 3:
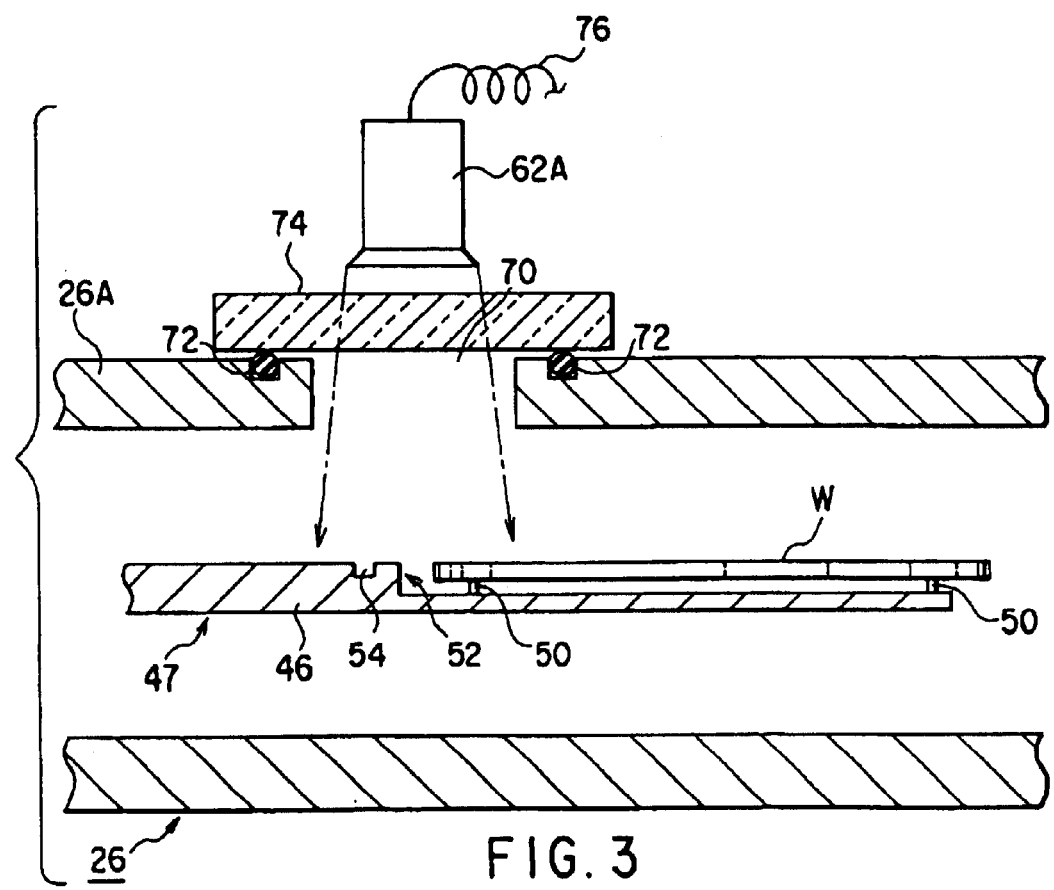
FIG. 3 is an enlarged sectional view showing the part where the image pick-up device of a misalignment detector shown in FIG. 2 is installed, along with the transfer arm.
Figure 4:
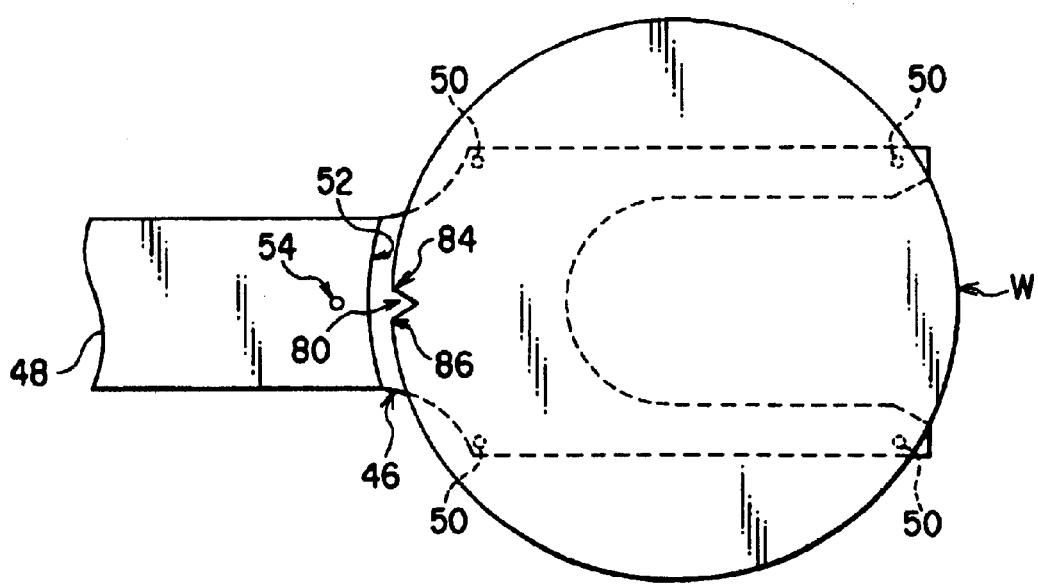
FIG. 4 is a plan view showing a state where a semiconductor wafer having a notch is placed at the normal position on a support portion of the transfer apparatus shown in FIG. 2.

The common transfer chamber 26 is provided with a transfer apparatus 42 disposed therein near the center, and having, e.g., an articulated transfer arm 44, which is rotatable and extensible/contractible. FIG. 2 is a block diagram showing the correlation between the transfer arm 44, misalignment detectors 62 and 64, and a control section 66. FIG. 3 is an enlarged sectional view showing the part of the transfer apparatus 42 where the image pick-up device of the misalignment detector 62 or 64 is installed, along with the transfer arm 44. FIG. 4 is a plan view showing a state where a semiconductor wafer having a notch is placed at the normal position on a support portion of the transfer apparatus 42.

The transfer arm 44 has a first arm portion 45 rotatably disposed on the bottom of the common transfer chamber 26, a second arm portion 46 rotatably connected to the distal end of the first arm portion 45, and a pick arm portion 47 rotatably connected to the distal end of the second arm portion 46. The pick arm portion 47 has forks (support portions) 48 at the opposite ends, each for placing a wafer W thereon. The transfer apparatus 42 holds wafers W on the forks 48, and transfer and deliver them between one of the cassette chambers 38A and 38B and one of the process chambers 30A to 30D and 32, and between the process chambers 30A to 30D and 32.

As shown in FIGS. 3 and 4, each of the forks 48 has, e.g., four, short projections 50 to place and hold a wafer W directly thereon. A step portion 52 is formed at the proximal portion of each fork 48 to prevent a wafer W held thereon from excessively slipping. The proximal portion of each fork 48 is also provided with a reference mark 54 that is optically observable. The reference mark 54 is of a size large enough to be recognized by an image pick-up device described later. For example, the reference mark 54 is formed of a hole having a diameter of about 0.1 to 0.5 mm and a depth of about 0.5 mm. The reference mark 54 is positioned on a line that extends through the center of each fork (support portion) 48 and in parallel with a direction in which a wafer W is transferred when the image pick-up device takes a detection image, as described later.

The misalignment detectors 62 and 64 of the transfer apparatus 42 are disposed in front of the gate valves 28B and 28D to correspond to the ports of the process chambers 30B and 30D, i.e., every other process chamber, in accordance with the order of the process steps. As also shown in FIG. 2, the misalignment detectors 62 and 64 have image pick-up devices 62A and 64A, information processing units 62B and 64B, and a common database 63. The database 63 stores a normal image that shows the positional correlation between the reference mark 54 and optically observable first and second portions of a wafer W, obtained when the wafer W is placed on a fork (support portion) 48 at the normal position. Each of the image pick-up devices 62A and 64A takes a detection image that shows the positional correlation between the reference mark 54 and the first and second portions of the wafer W, when the transfer arm 44 transfers the wafer W.

Each of the information processing units 62B and 64B obtains the misalignment amount of the wafer W relative to the normal position, on the basis of the normal image and detection image. Each of the information processing units 62B and 64B inputs the misalignment amount of the wafer W thus obtained into the control section 66 of the transfer apparatus 42, such as a microcomputer. The control section 66 controls the drive unit 68 to offset the obtained misalignment amount of the wafer W, when the transfer arm 44 transfers the wafer W into the process chamber. As shown in FIG. 4, in this embodiment, the first and second portions of the wafer W to be observed are opposite corners of the notch 80 of the wafer W. The maximum width of the notch 80 is, e.g., about 1 mm.

The misalignment detectors 62 and 64 have completely the same arrangement. Accordingly, only one misalignment detector 62 will be explained as an example. As also shown in FIG. 3, an observation hole 70 having a diameter of about 30 mm is formed in a ceiling plate 26A that defines the common transfer chamber 26. The observation hole 70 is provided with a light transmission window 74 made of a transparent material, such as quartz, which is airtightly attached thereto by a sealing member 72, such as an O-ring. The image pick-up device 62A is disposed above the light transmission window 74, so that it can take an image of the inside of the common transfer chamber 26 through the light transmission window 74. The image information taken by the image pick-up device 62A is sent to the information processing unit 62B through a line 76, as described above (see FIG. 2).

The image pick-up device 62A is disposed at a position directly above a path 78 through which each fork 48 moves when the transfer arm 44 transfers the wafer W into and from the process chamber 30B. The image pick-up device 62A is set to be operable at a high speed with which it can accurately take an image of a fork 48 without stopping the fork 48 during transfer of the wafer W. The image pick-up device 62A may be formed of, e.g., a CCD camera, and more specifically an image sensor CV-500 (a trade name; KEYENCE CORPORATION) having a high speed and high accuracy monitor built therein.

The image pick-up device 62A has a field of view wide enough to take a detection image of one image frame that contains the reference mark 54 of a fork 48 and the opposite corners of the notch 80 of the wafer W (see FIG. 4), even where the wafer W is placed on the fork (support portion) 48 with a considerable misalignment relative to the normal position. The normal image stored in the database 63 is also formed of one image frame taken by the image pick-up device that contains the reference mark 54 and the opposite corners of the notch 80 of the wafer W. However, each of the detection image and normal image may be formed of a plurality of image frames.

Next, explanation will be given of a process method and transfer method in the processing system 24 and transfer apparatus 42, with reference also to FIG. 5.

Figure 5:
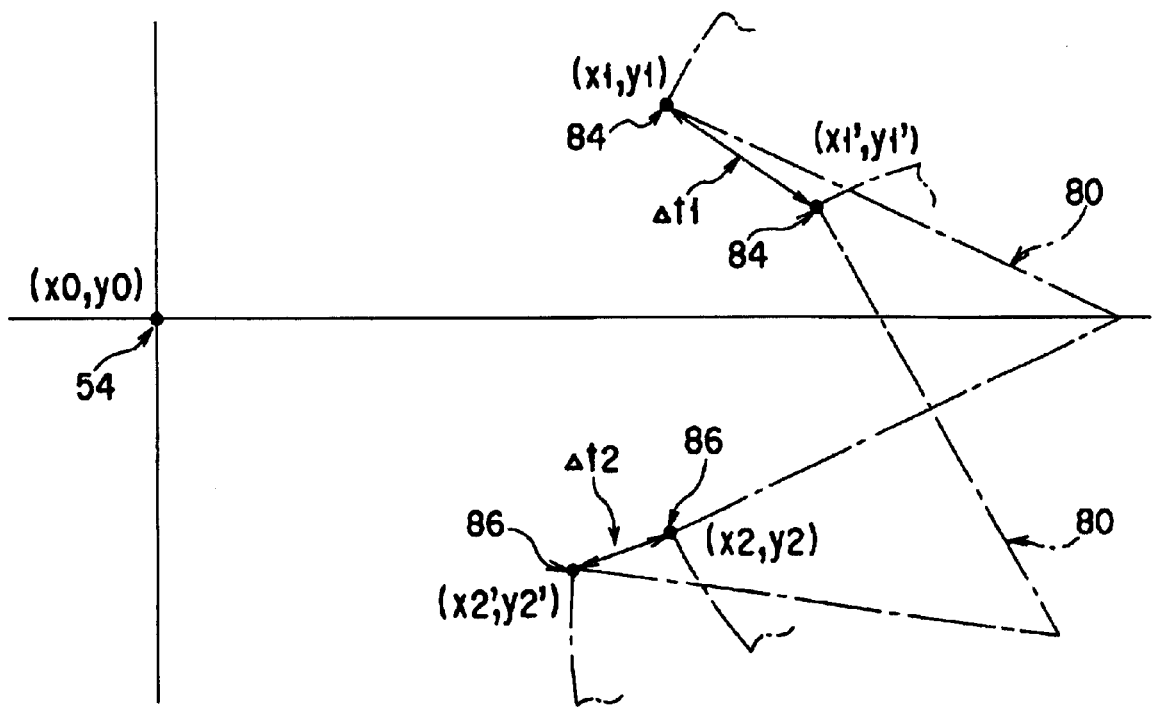
FIG. 5 is a view schematically showing a processed image in a coordinate system, taken by the image pickup device, in the transfer apparatus shown in FIG. 2.

FIG. 5 is a view schematically showing a processed image in a coordinate system, taken by the image pickup device, in the transfer apparatus 42. As described above, this embodiment employs the opposite corners of the notch 80 of the wafer W (first and second portions) 84 and 86 (see FIG. 4) as observation target portions, to recognize the state of the wafer W placed on a fork 48. The misalignment amount of the wafer W is detected by taking an image of the first and second portions and the reference mark 54 of the fork 48.

In FIG. 5, coordinates (x0, y0) denote the position of the reference mark 54. Coordinates (x1, y1) and coordinates (x2, y2) denote positions of the first and second portions 84 and 86, respectively, obtained when the wafer W is placed on the fork (support portion) 48 at the normal position. Coordinates (x1', y1') and coordinates (x2', y2') denote positions of the first and second portions 84 and 86, respectively, obtained when the wafer W is placed on the fork (support portion) 48 with a misalignment relative to the normal position.

A semiconductor wafer W is processed in the following order. In this case, as explained above, the first to fourth process chambers 30A to 30D perform deposition of a first tantalum oxide film, modification of the first tantalum oxide film, deposition of a second tantalum oxide film, and modification of the second tantalum oxide film, respectively.

At first, the transfer arm 44 is operated to rotate and extend/contract to pick up an unprocessed semiconductor wafer W stored in one, e.g., 38A of the cassette chambers, through the opened gate valve 36A. The transfer arm 44 holds the wafer W on one of the forks 48, transfers it into the common transfer chamber 26, and rotates to place it on the rotary table 56 of the alignment mechanism 60. The alignment mechanism 60 rotates the wafer W, and detects its edge by the line sensor 58 to detect the misalignment of wafer W.

Then, when the transfer arm 44 picks up the wafer W by one of the forks 48, the transfer arm 44 is controlled to offset the misalignment detected by the alignment mechanism 60, so that it can support the wafer W on the fork 48 at the normal position. The positional relationship at this time between the reference mark 54 of the fork 48 and the corner portions 84 and 86 of the notch 80 of the wafer W takes on a state shown with the coordinates (x0, y0), (x1, y1), and (x2, y2) in FIG. 5. The transfer arm 44 directs this aligned wafer W toward the process chamber 30A, which is predetermined. Then, the transfer arm 44 extends to transfer the wafer W into the process chamber 30A through the opened gate valves 28A and places it on the worktable 34A.

Then, the process chamber 30A performs a predetermined process, i.e., deposition of the first tantalum oxide film, on the wafer W. After this process, the transfer arm 44 extends to insert one of the forks 48 into the process chamber 30A through the opened gate valves 28A, and support the processed wafer W on the fork 48. Then, the transfer arm 44 contracts to transfer the wafer W into the common transfer chamber 26. At this time, the wafer W on the fork 48 may have a misalignment relative to the normal position.

In order to subject the wafer W to the next process, the transfer arm 44 rotates to direct the wafer W toward the next process chamber, e.g., 30B. Then, the transfer arm 44 transfers the wafer W into the process chamber 30B and places it on the worktable 34B, as in the operation of transferring the wafer W into the process chamber 30A. At this time the misalignment detector 62 detects the misalignment amount of the wafer W. Then, the operation, i.e., the rotational amount and extension/contraction amount, of the transfer arm 44 is controlled to offset the detected misalignment amount, to place the wafer W on the worktable 34B at the proper position. This offset correction will be described later.

Then, the process chamber 30B performs a predetermined process, i.e., the first modification process, on the wafer W. After this process, the transfer arm 44 picks up the wafer W, and transfers it into the common transfer chamber 26. At this time, the wafer W may be placed on a fork 48 again with a misalignment relative to the normal position. The misalignment detector 62 detects this misalignment amount. When the transfer arm 44 transfers the wafer W into the process chamber 30C for the next process, the operation of the transfer arm 44 is controlled to offset the detected misalignment amount, to place the wafer W on the worktable 34C at the proper position.

Then, the process chamber 30C performs a predetermined process, i.e., deposition of the second tantalum oxide film, on the wafer W. After this process, the transfer arm 44 picks up the wafer W from the process chamber 30C, and places it on the worktable 34D in the process chamber 30D. The operation at this time is the same as that of transferring the wafer W from the process chamber 30A to the process chamber 30B. Specifically, in the course of transferring the wafer W into the process chamber 30D, the misalignment detector 64 detects the misalignment amount of the wafer W. Then, the operation of the transfer arm 44 is controlled to offset the detected misalignment amount, to place the wafer W on the worktable 34C at the proper position.

Then, the process chamber 30D performs a predetermined process, i.e., the second modification process, on the wafer W. After all the processes on the wafer W are completed, as described above, the processed wafer W is stored in a cassette in, e.g., the other cassette chamber 38B. In this respect, immediately after the second modification process is finished, the wafer W has a very high temperature. Accordingly, the wafer W is once transferred into the cooling process chamber 32, and is cooled therein, and then is transferred into the cassette chamber 38.

At this time, the processes on the wafer have been completed, the wafer W is allowed to have a misalignment on a fork 48 while being transferred. However, to increase the transfer accuracy, the misalignment detector 64 detects the misalignment amount of the wafer W when the wafer W is transferred from the fourth process chamber 30D. Then, the wafer W is transferred into the cooling process chamber 32, while offsetting the detected misalignment amount.

As described above, when the wafer W held on the fork 48 is transferred to and from the process chambers 30B and 30D, the misalignment amount of the wafer W on a fork 48 is detected. The wafer W passes through a position directly below each of the image pick-up devices 62A and 64A of the misalignment detectors 62 and 64. At this time, each of the image pick-up devices 62A and 64A takes a detection image that shows the positional correlation between the reference mark 54 of the transfer arm 44 and the first and second portions 84 and 86 of the wafer W. Each of the information processing units 62B and 64B compares the detection image with the normal image stored in the database 63 by means of image-processing, to obtain the misalignment of the wafer W on the fork (support portion) 48 relative to the normal position.

In FIG. 5, the positions of the reference mark 54 and the first and second portions 84 and 86 of the wafer W in the normal image are indicated with the coordinates (x0, y0), coordinates (x1, y1), and coordinates (x2, y2), respectively. On the other hand, when the wafer W is placed on the fork 48 with a misalignment relative to the normal position, the positions of the first and second portions 84 and 86 are indicated with the coordinates (x1', y1') and coordinates (x2', y2'), respectively. Each of the information processing units 62B and 64B performs image processing such that the reference mark 54 in the normal image coincides with the reference mark 54 in the detection image, thereby obtaining the misalignment of the detection image relative to the normal image. Then, it calculates the misalignment amount $\Delta t1$ of the coordinates (x1', y1') of the detection image relative to the coordinates (x1, y1) of the normal image, and the misalignment amount $\Delta t2$ of the coordinates (x2', y2') of the detection image relative to the coordinates (x2, y2) of the normal image. The control section 66 controls the operation, i.e., the rotational amount and extension/contraction amount, of the transfer arm 44 to offset the misalignment amounts $\Delta t1$ and $\Delta t2$, to place the wafer W on the worktable at the proper position.

As described above, with transfer method according to the embodiment of the present invention, the misalignment amount of a wafer W on the fork 48 is detected without stopping the transfer operation of the wafer W. As a consequence, the wafer transfer operation can be performed swiftly, thereby improving the throughput of wafer processing.

In the semiconductor processing system shown in FIG. 1, the process chambers perform deposition and modification. Processes to be performed in the process chambers are not limited to specific ones. In the system shown in FIG. 1, the two misalignment detectors 62 and 64 are disposed at every other process chamber, in order to improve wafer transfer efficiency. However, only one misalignment detector may be used in the system. In this case, if a wafer W may be placed on a fork (support portion) 48 with a misalignment relative to the normal position, the wafer W is caused to pass below the image pick-up device of this misalignment detector, thereby detecting the misalignment amount. In the system shown in FIG. 1, the pick arm portion 47 of the transfer arm 44 has two forks 48, but it may be designed to have only one fork 48.

Figure 6:
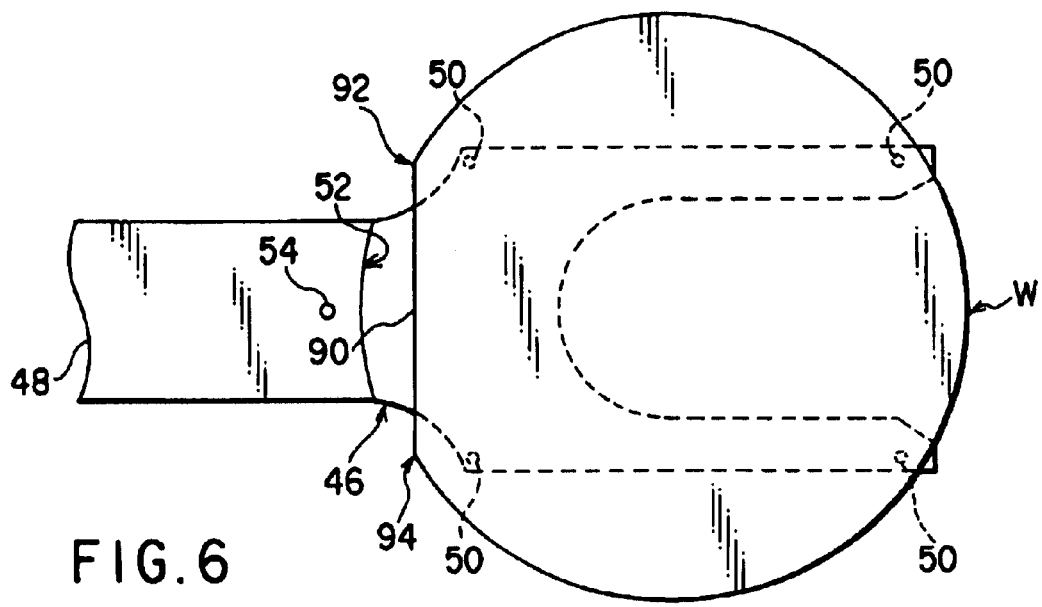
FIG. 6 is a plan view showing a state where a semiconductor wafer having an orientation flat is placed at the normal position on a support portion of the transfer apparatus shown in FIG. 2.
Figure 7:
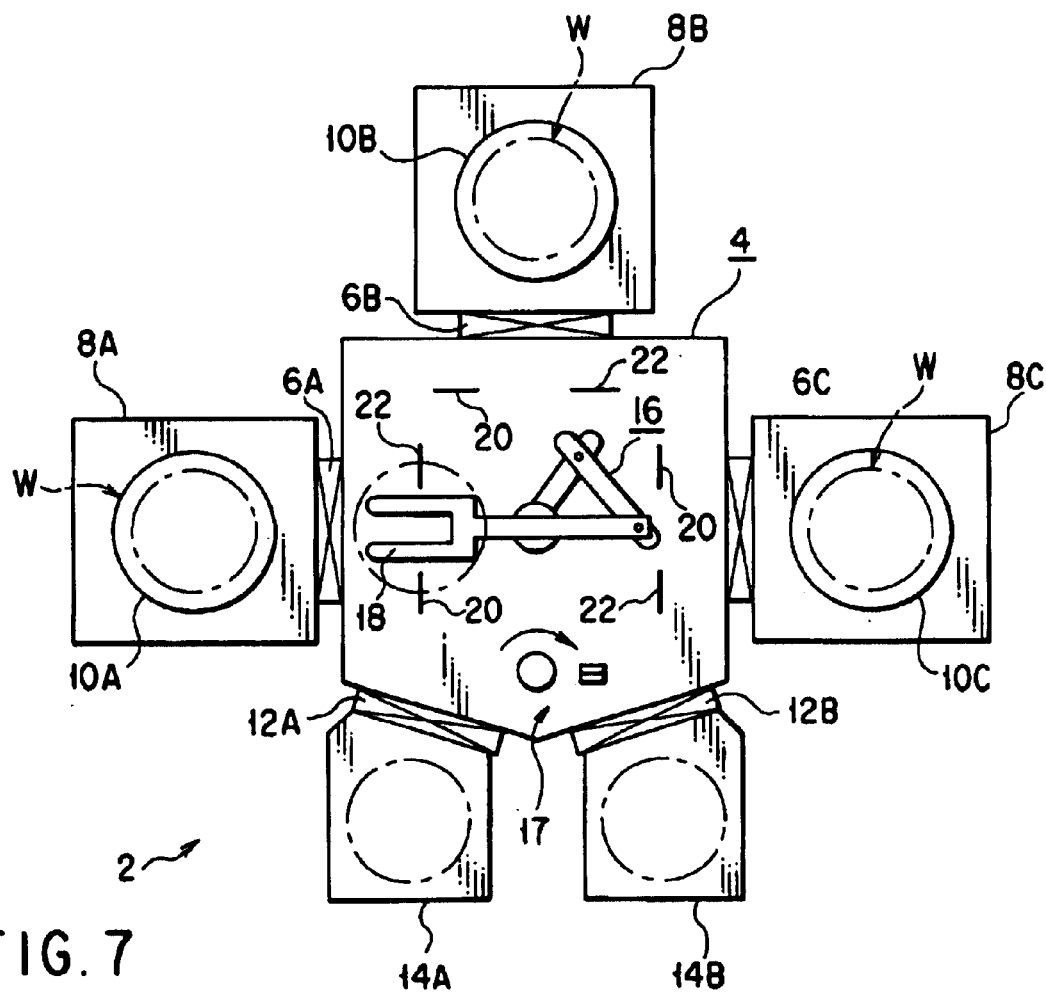
FIG. 7 is a schematic plan view showing a conventional processing system of the cluster tool type.

In the system shown in FIG. 1, a wafer W having a notch 80 is handled as a target substrate, but a wafer having an orientation flat may be handled as a target substrate. FIG. 6 is a plan view showing a state where a semiconductor wafer having an orientation flat 90 is placed at the normal position on a support portion of the transfer apparatus 42 shown in FIG. 2. In this case, corner portions 92 and 94 at the opposite ends of the linear orientation flat 90 function as observation target portions. In general, the length of the orientation flat 90 is about 60 to 70 mm, which is far lager than that of the notch 80. Accordingly, an image pick-up device used in this case preferably has a large field of view. A semiconductor wafer to be handled is not limited to a specific size, but any one of, e.g., 6-inch, 8-inch, and 12-inch wafers may be handled as a target substrate. Furthermore, in place of a semiconductor wafer, another substrate, such as an LCD substrate or glass substrate, may be handled as a target substrate.

The present invention is not limited to the embodiments described above, but can be practiced in various manners without departing from the spirit and scope of the invention. The features of the embodiments described above can be arbitrarily combined with each other in practice, thereby obtaining combined effects.

What is claimed is:

1. A transfer apparatus for transferring a target substrate, which has optically observable first and second portions, in a semiconductor processing system, the apparatus comprising:

a transfer member having a support portion to place the target substrate thereon;

a drive unit configured to drive the transfer member so as to transfer the target substrate;

a reference mark disposed adjacent to the support portion, and configured to move integratedly with the support portion when the transfer member transfers the target substrate;

a storage section, which stores a normal image that shows a positional correlation between the reference mark and the first and second portions, obtained when the target substrate is placed on the support portion at a normal position;

an image pick-up device configured to take a detection image that shows a positional correlation between the reference mark and the first and second portions, when the transfer member transfers the target substrate; and an information processing unit configured to obtain a misalignment amount of the target substrate relative to the normal position, based on the normal image and the detection image.

2. The apparatus according to claim 1, wherein the image pick-up device is configured to take the detection image while the transfer member is moving along with the target substrate placed thereon.

3. The apparatus according to claim 1, wherein the reference mark is disposed on a proximal portion of the transfer member, which supports the support portion.

4. The apparatus according to claim 3, wherein the reference mark is positioned on a line that extends through a center of the support portion and in parallel with a direction in which the target substrate is transferred when the detection image is taken.

5. The apparatus according to claim 1, wherein the first and second portions comprise corner portions formed at an edge of the target substrate.

6. The apparatus according to claim 1, wherein the reference mark and the first and second portions in the normal image are positioned in one image frame taken by the image pick-up device.

7. The apparatus according to claim 1, wherein the transfer member is extensible/contractible and rotatable.

8. The apparatus according to claim 7, further comprises a control section configured to control the drive unit so as to offset a misalignment amount of the target substrate obtained by the information processing unit, when the transfer member transfers the target substrate.

9. A semiconductor processing system, comprising:

a plurality of airtight process chambers configured to perform processes on a target substrate, which has optically observable first and second portions;

an airtight common transfer chamber connected to the plurality of process chambers respectively via gates; and a transfer apparatus disposed in the transfer chamber to transfer the target substrate, wherein the transfer apparatus comprises a transfer member having a support portion to place the target substrate thereon, and being extensible/contractible and rotatable, a drive unit configured to drive the transfer member so as to transfer the target substrate, a reference mark disposed adjacent to the support portion, and configured to move integratedly with the support portion when the transfer member transfers the target substrate, a storage section, which stores a normal image that shows a positional correlation between the reference mark and the first and second portions, obtained when the target substrate is placed on the support portion at a normal position, an image pick-up device configured to take a detection image that shows a positional correlation between the reference mark and the first and second portions, when the transfer member transfers the target substrate, an information processing unit configured to obtain a misalignment amount of the target substrate relative to the normal position, based on the normal image and the detection image, and a control section configured to control the drive unit so as to offset a misalignment amount of the target substrate obtained by the information processing unit, when the transfer member transfers the target substrate into the process chamber.

10. The system according to claim 9, wherein the image pick-up device is disposed outside the common transfer chamber, and a light transmission window is formed on the common transfer chamber to correspond to the image pick-up device.

11. The system according to claim 9, wherein the image pick-up device is disposed in front of one of the gates provided at the plurality of process chambers.

12. The system according to claim 11, wherein the image pick-up device is one of a plurality of image pick-up devices equivalent to each other, and the plurality of image pick-up devices are disposed in front of some of the gates provided at the plurality of process chambers.

13. The system according to claim 12, wherein the number of the plurality of image pick-up devices is smaller than the number of the plurality of process chambers.

14. The system according to claim 9, wherein the image pick-up device is configured to take the detection image while the transfer member is moving along with the target substrate placed thereon.

15. The system according to claim 9, wherein the reference mark is disposed on a proximal portion of the transfer member, which supports the support portion.

16. The system according to claim 15, wherein the reference mark is positioned on a line that extends through a center of the support portion and in parallel with a direction in which the target substrate is transferred when the detection image is taken.

17. The system according to claim 9, wherein the first and second portions comprise corner portions formed at an edge of the target substrate.

18. The system according to claim 9, wherein the reference mark and the first and second portions in the normal image are positioned in one image frame taken by the image pick-up device.

19. A transfer method for transferring a target substrate, which has optically observable first and second portions, in a semiconductor processing system, the method comprising:

preparing a transfer apparatus, which comprises
a transfer member having a support portion to place the target substrate thereon,
a drive unit configured to drive the transfer member so as to transfer the target substrate, and
a reference mark disposed adjacent to the support portion, and configured to move integratedly with the support portion when the transfer member transfers the target substrate;

storing a normal image that shows a positional correlation between the reference mark and the first and second portions, obtained when the target substrate is placed on the support portion at a normal position;

taking a detection image that shows a positional correlation between the reference mark and the first and second portions, when the transfer member transfers the target substrate; and obtaining a misalignment amount of the target substrate relative to the normal position, based on the normal image and the detection image.

20. The method according to claim 19, wherein the transfer member is extensible/contractible and rotatable, and the method further comprises transferring the target substrate by the transfer member, while controlling the drive unit to offset the obtained misalignment amount of the target substrate.

* * * * *